(12) United States Patent
Lee et al.

(10) Patent No.: US 11,856,737 B2
(45) Date of Patent: Dec. 26, 2023

(54) RACK TEMPERATURE CONTROLLING METHOD AND SYSTEM

(71) Applicants: Inventec (Pudong) Technology Corporation, Shanghai (CN); INVENTEC CORPORATION, Taipei (TW)

(72) Inventors: Chien-Ming Lee, Taipei (TW); Kai-Yang Tung, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 157 days.

(21) Appl. No.: 17/547,354

(22) Filed: Dec. 10, 2021

(65) Prior Publication Data

US 2023/0080658 A1 Mar. 16, 2023

(30) Foreign Application Priority Data

Sep. 13, 2021 (CN) .......................... 202111068635.1

(51) Int. Cl.
*H05K 7/20* (2006.01)
*G05D 7/06* (2006.01)
*G05D 23/19* (2006.01)

(52) U.S. Cl.
CPC ....... *H05K 7/20836* (2013.01); *G05D 7/0676* (2013.01); *G05D 23/1917* (2013.01); *H05K 7/20736* (2013.01)

(58) Field of Classification Search
CPC .......... H05K 7/20836; H05K 7/20736; G05D 23/1934; G05D 7/0676
See application file for complete search history.

(56) References Cited

U.S. PATENT DOCUMENTS

| 10,034,417 B2* | 7/2018 | Billet | H05K 7/20745 |
| 2019/0159366 A1* | 5/2019 | Lee | H05K 7/20718 |

* cited by examiner

Primary Examiner — Lionel Nouketcha
(74) Attorney, Agent, or Firm — Locke Lord LLP; Tim Tingkang Xia, Esq.

(57) ABSTRACT

A rack temperature controlling method includes performing the following operations through a controller: obtaining a rack temperature data, calculating a temperature variant according to the rack temperature data, calculating a temperature deviation according to the temperature variant and a reference temperature, calculating a target speed according to the temperature deviation, and adjusting a speed of a fan to the target speed. A rack temperature controlling system including a thermometer and a controller is further provided. The thermometer measures and outputs a rack temperature data. The controller receives the rack temperature data, and calculates a temperature variant according to the rack temperature data. The controller further calculates a temperature deviation according to the temperature variant and a reference temperature, calculates a target speed according to the temperature deviation, and adjusts a speed of a fan to the target speed.

8 Claims, 5 Drawing Sheets

RACK TEMPERATURE CONTROLLING METHOD AND SYSTEM

CROSS-REFERENCE TO RELATED APPLICATIONS

This non-provisional application claims priority under 35 U.S.C. § 119(a) on Patent Application No(s). 202111068635.1 filed in China on Sep. 13, 2021, the entire contents of which are hereby incorporated by reference.

BACKGROUND

1. Technical Field

This disclosure relates to a rack temperature controlling method and system.

2. Related Art

Often times, after a server room is built, it is difficult to realize complete heat isolation due to the inherent structural design. Therefore, one or more local hot spots are easily generated when the server room is in operation. For example, when a temperature of an inlet of a rack or a server in the rack where cold air flows in is too high, one or more local hot spots may be generated at the rack/server. Take FIG. 1 as an example, the blank arrows (i.e. the unfilled arrows) indicate the cold air flow, and the solid arrows indicate the hot air flow. Usually, a local hot spot is caused by insufficient airflow at the inlet of the rack. Take a third server S3 in FIG. 1 as an example, when the cold air flow at the inlet of the third server S3 is insufficient, a cold aisle pressure Pc becomes smaller than a hot aisle pressure Ph, causing the hot air coming out of the outlet of the third server S3 to circulate back to the inlet of the third server S3. A local hot spot HS may be generated at the inlet of the third server S3 with this kind of circulation, which is referred to as hot air recirculation.

When the server is dissipated through a fan, the fan speed may cause a local negative pressure at the inlet of the server, and the negative pressure is likely to cause the hot air coming out of the outlet of the server to flow back to the server, which leads to high temperature at the inlet of the server. When the inlet of the server suffers from insufficient airflow, the cold aisle pressure (on the fan airflow receiving side of the server) is smaller than the hot aisle pressure (on the outlet side of the server), which leads to hot air recirculation (hot air coming out of the outlet returns to the inlet of the server).

One of the solutions used for hot air recirculation is to use the structure of raised floor RF as well as increase the rotation speed of the blower of the computer room air conditioner CRAC to improve the air circulation in the server room. Please refer to FIGS. 2a and 2b, wherein FIG. 2a is a top view of a plurality of racks, and FIG. 2b is a side view of two of the racks. The causes of local hot spot on racks C2 and C9 may be the configuration of the server room (for example, structural configuration, wiring interferences, etc.). As a result, the resistive force for the air to flow to racks C2 and C9 may be huge. That is, even by using the raised floor design and increasing the speed of the blower of the computer room air conditioner CRAC, the hot spots on racks C2 and C9 are still unlikely to be eliminated. Further, other racks (for example, racks C1, C3 to C8 and C10 to C12) may be over cooled due to the speed increase of the blower.

Another solution used for hot air recirculation is to use a raised floor RF structure. As shown in FIGS. 3a and 3b, by installing a fan F under the raised floor RF, more cold air may be delivered to the server/rack with local hot spots. However, the method for controlling the fan F is usually on the basis of the hottest situation (i.e. worst case), which makes the control of the fan F become very complicated. Controlling the fan F of the active ventilation raised floor RF at the maximum speed may easily cause excessive operation of the cooling system, thus increasing unnecessary electricity expenses.

SUMMARY

Accordingly, this disclosure provides a rack temperature controlling method and system.

According to one or more embodiment of this disclosure, a rack temperature controlling method, comprises: obtaining rack temperature data; calculating a temperature variance according to the rack temperature data; calculating a temperature deviation according to the temperature variance and a reference temperature; and calculating a target fan speed according to the temperature deviation, and adjusting a fan speed to the target fan speed.

According to one or more embodiment of this disclosure, a rack temperature controlling system, comprises: a thermometer, configured to sense and output rack temperature data; and a controller, in signal-transmittable connection with the thermometer, the controller receiving the rack temperature data, and calculating a temperature variance according to the rack temperature data, wherein the controller further is configured to calculate a temperature deviation according to the temperature variance and a reference temperature to calculate a target fan speed according to the temperature deviation, and adjust a fan speed to the target fan speed.

In view of the above description, the rack temperature controlling method and system according to the present disclosure may maintain the temperature of each server in the rack at an appropriate temperature by the feedback of the rack temperature data. Further, in a server room with multiple racks, by the rack temperature controlling method and system according to the present disclosure, the controller may not need to adjust the fan speed of every fan, but only adjust the fan speed for the rack/server with hot spot. Therefore, according to the rack temperature controlling method and system according to the present disclosure, the fan speed may be adjusted more efficiently, and the overall power consumption of the cooling system (for example, may include blower, fan, etc.) of the server room may be lowered. Further, the rack temperature controlling method and system according to the present disclosure may prevent the generation of hot spots by locally increasing the airflow.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one skilled in the art may easily understand the objective and the provided advantages of the present invention after referring to the detailed description, claims and drawings. The following embodiments are merely for illustrating various aspects of the present invention, rather than limiting the scope of the present invention.

Figure 4:
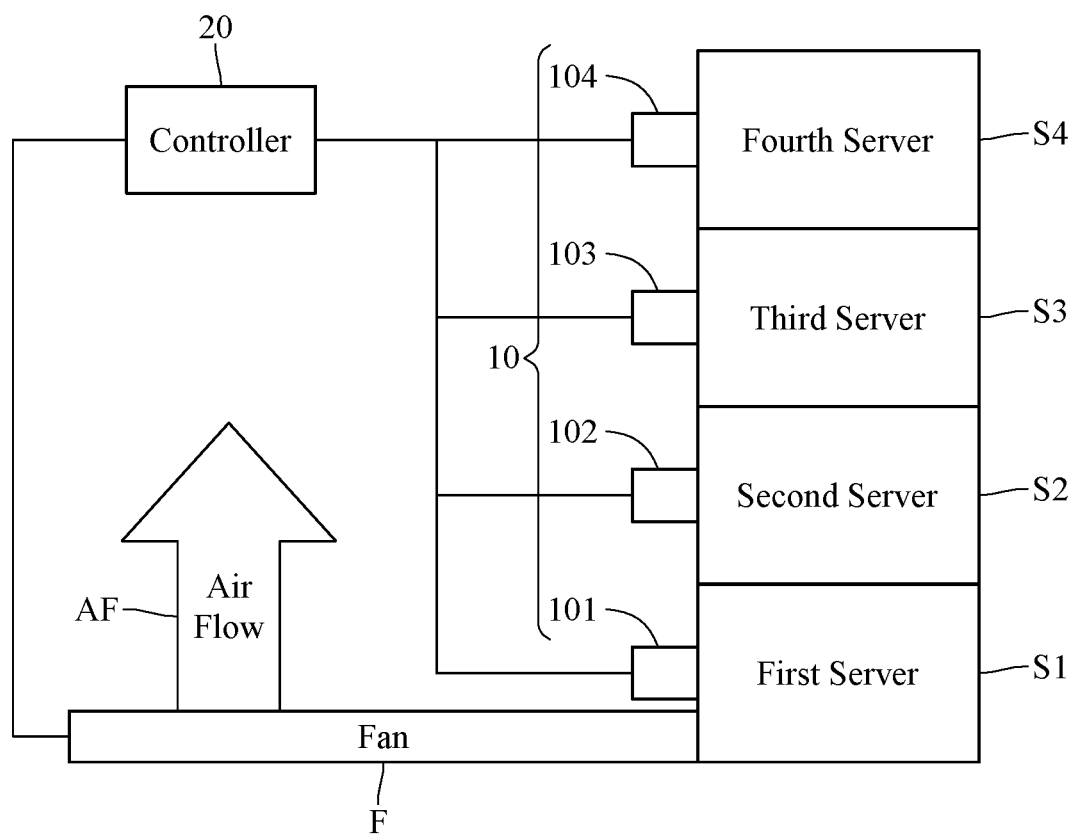
FIG. 4 is a diagram illustrating a rack temperature controlling system according to an embodiment of the present disclosure.

Please refer to FIG. 4. FIG. 4 is a diagram illustrating a rack temperature controlling system according to an embodiment of the present disclosure. The rack temperature controlling system of the present disclosure comprises a thermometer 10 and a controller 20. The thermometer 10 is in signal-transmittable connection with the controller 20. That is, the thermometer 10 may be electrically connected to the controller 20, or communicably connected with the controller 20. Further, the controller 20 may further be in signal-transmittable connection with a fan F, to control the speed of the fan F according to the measurement result of the thermometer 10. The controller 20 of the present disclosure may be a microcontroller, or a proportional integral derivative (PID) controller. The present disclosure does not limit the types of the controller 20.

The thermometer 10 of the present disclosure is disposed at an inlet of the rack, and is preferably disposed at an inlet corresponding to each server on the rack to measure an inlet temperature, wherein said inlet is used for letting air (cold air ideally) enter the rack for dissipation. Specifically, the thermometer 10 of the present disclosure may comprise a first thermometer 101, a second thermometer 102, a third thermometer 103 and a fourth thermometer 104. One rack preferably has a plurality of inlets (e.g., each one of the first sever S1, second server S2, third server S3 and fourth server S4 in FIG. 4), each preferably aligning with a respective server. The first thermometer 101 to the fourth thermometer 104 are respectively disposed at the inlet of each server.

Therefore, take FIG. 4 as an example, the first thermometer 101 may be disposed at the inlet of the first sever S1, to measure the inlet temperature of the first sever S1; the second thermometer 102 may be disposed at the inlet of the second sever S2, to measure the inlet temperature of the second sever S2; the third thermometer 103 may be disposed at the inlet of the third sever S3, to measure the inlet temperature of the third sever S3; and the fourth thermometer 104 may be disposed at the inlet of the fourth sever S4, to measure the inlet temperature of the fourth sever S4. It should be noted that FIG. 4 exemplarily illustrates four servers, the present disclosure does not limit the number of the servers. The embodiment shown in FIG. 4 may further adopt the structure of raised floor with active tile, but the present disclosure is not limited thereto.

Figure 5:
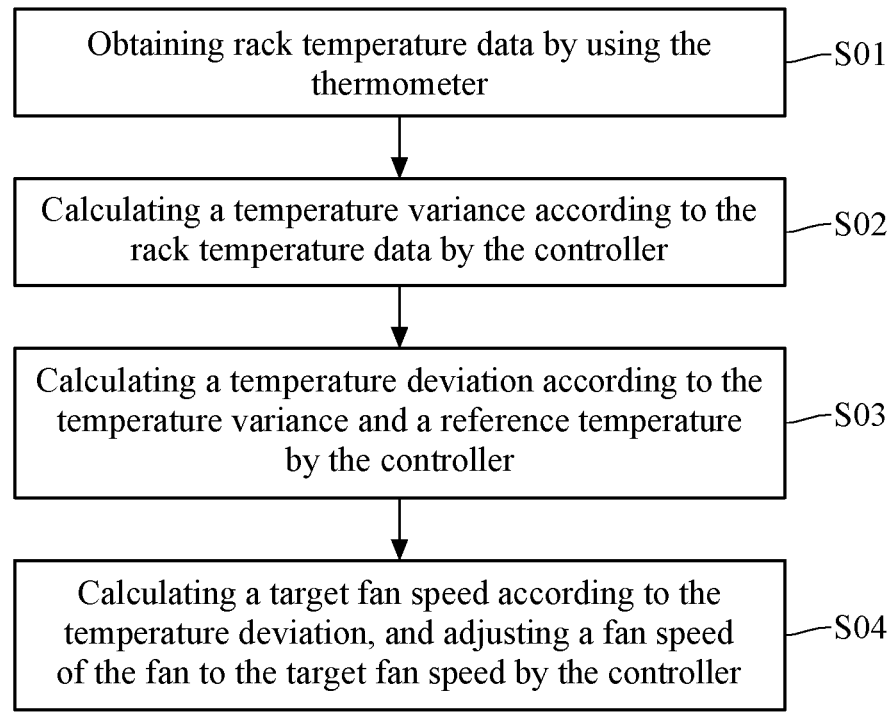
FIG. 5 illustrates a flow chart of rack temperature controlling method according to an embodiment of the present disclosure.

Please refer to FIGS. 4 and 5, wherein FIG. 5 illustrates a flow chart of a rack temperature controlling method according to an embodiment of the present disclosure.

Please refer to step S01: obtaining rack temperature data by using the thermometer 10. As described above, the thermometer 10 comprises the first thermometer 101 to the fourth thermometer 104, and the rack temperature data comprises the inlet temperatures obtained by the first thermometer 101 to the fourth thermometer 104. The controller 20 then obtains the rack temperature information from the thermometer 10.

Please refer to step S02: calculating a temperature variance according to the rack temperature data by the controller 20. The rack temperature data comprises the inlet temperatures measured by each thermometer, and the temperature variance represents an average distance between all inlet temperatures and an average temperature, wherein the average temperature is the average of the inlet temperatures. The temperature variance is calculated by the following equation (1) as follows:

$$y = \mathrm{Var}(T_i) = \frac{\sum_{i=1}^{n}(T_i - v)^2}{n} \qquad \text{equation (1)}$$

wherein $\mathrm{Var}(T_i)$ represents the temperature variance; $T_i$ is the i-th inlet temperature; v is the average temperature of the inlet temperatures; and n is a number of the inlet temperatures.

For example, in the example shown by FIG. 4, $T_i$ is each of the inlet temperatures measured by each of the first thermometer 101 to the fourth thermometer 104; n may be the number of the severs or the thermometers, or the number of the inlet temperatures (in the example shown by FIG. 4, n=4); and v is the average of the inlet temperatures, which is obtained by dividing the sum of $T_i$ by the number of the inlet temperatures (or the number of the severs or the thermometers) (n).

Figure 1:
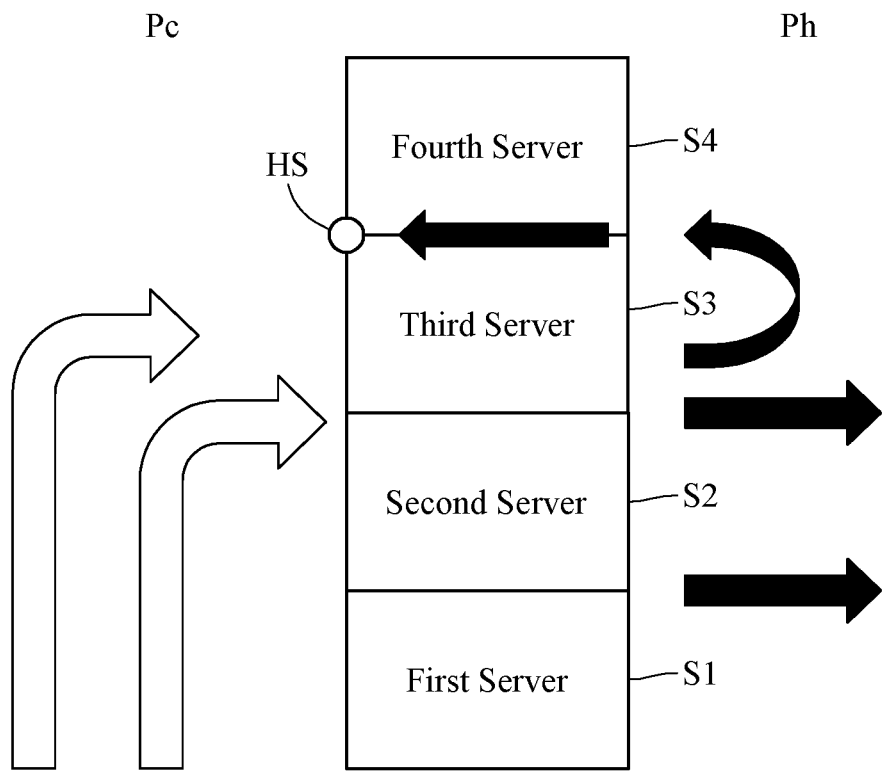
FIG. 1 is a schematic diagram showing a local hot spot generated on the rack.
Figure 2A:
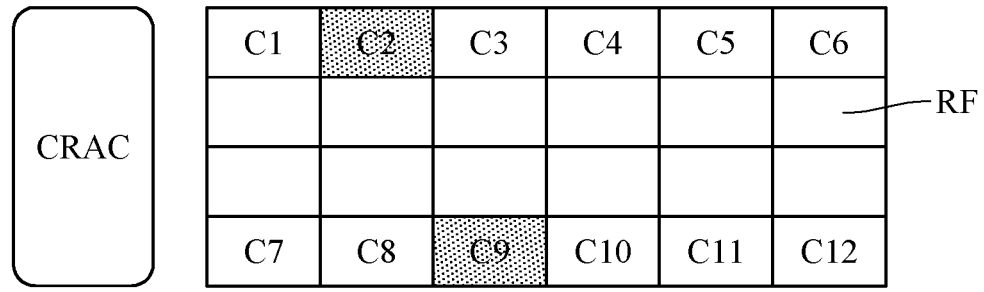
FIGS. 2a and 2b are schematic diagrams showing a related art technique using a raised floor structure and computer room air conditioner to solve the problem of hot air recirculation.
Figure 2B:
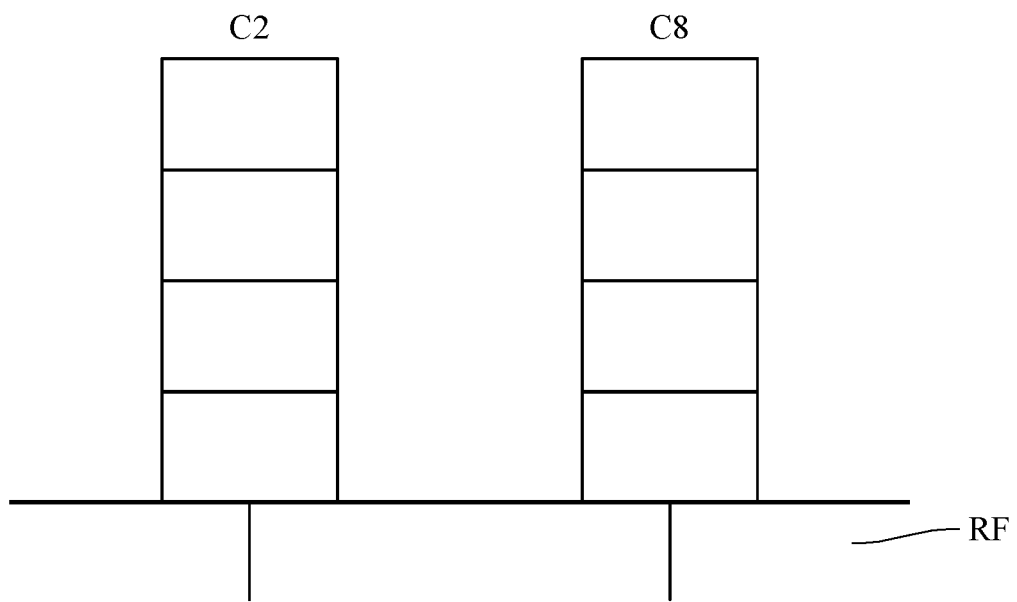
Figure 3A:
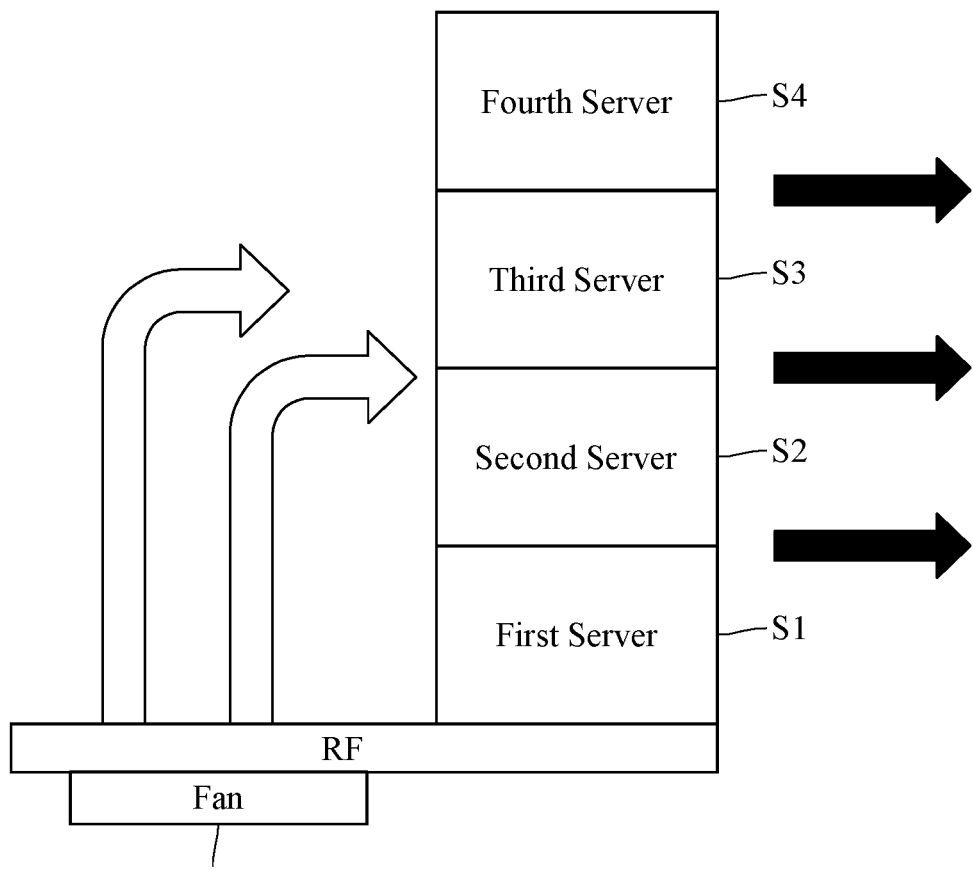
FIGS. 3a and 3b are schematic diagrams showing the prior art of using raised floor structure to solve the problem of hot air recirculation.
Figure 3B:
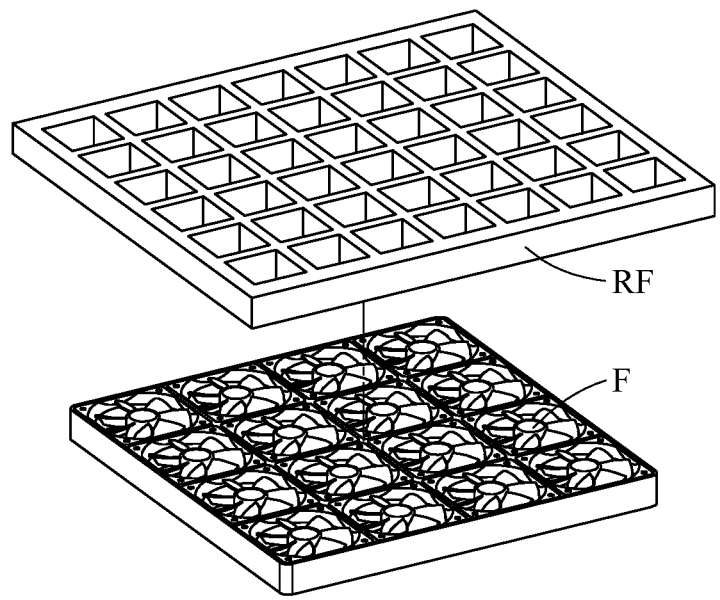

Specifically, the temperature variance y represents the distribution of inlet temperatures of the first sever S1 to the fourth server S3. The purpose of calculating the temperature variance lies in that, ideally, the average temperature v is close to a reference temperature of the air flow AF when the fan F provides sufficient air flow AF and no hot spot is generated, wherein the reference temperature may be a predetermined cold air temperature provided by the fan F; and when a hot spot HS As shown in FIG. 1 is generated on one of the server on the rack, the temperature variance y may then increase accordingly. Therefore, the controller 20 may determine the difference between the distribution situation of the inlet temperatures and the predetermined cold air temperature of the rack, so as to adjust the flow of the air flow AF according to a temperature deviation.

Please refer to step S03: calculating the temperature deviation according to the temperature variance and the reference temperature by the controller 20. The temperature deviation is a difference between the reference temperature and the temperature variance, wherein the reference temperature is the predetermined temperature of cold air provided by the fan F. The temperature deviation is calculated by the following equation (2):

$$e = T_{ref} - y \qquad (2)$$

wherein e is the temperature deviation; $T_{ref}$ is the reference temperature ($T_{ref}$ may also be referred to as reference variation); and y is the temperature variance calculated using equation (1).

Similar to the description above, when the airflow AF provided by the fan F is sufficient, the temperature deviation e is close to zero; and when a hot spot HS as shown in FIG. 1 appears at a server of the rack, the temperature variance y changes, and the temperature deviation e increases accordingly.

Please refer to step S04: calculating a target fan speed according to the temperature deviation, and adjusting a fan speed of the fan F to the target fan speed by the controller 20. The target fan speed is calculated by the following equation (3):

$$u = K_P \times e + K_I \times \int e\, dt + K_D \frac{de}{dt} \quad (3)$$

wherein u represents the target fan speed; $K_P$, $K_I$ and $K_D$ are control parameters; e represents the temperature deviation calculated by equation (2).

Therefore, when a hot spot occurs on the rack due to nonuniform temperature distribution, the temperature deviation e increases. Further, as may be understood according to equation (3), the target fan speed u increases as the temperature deviation e increases. Accordingly, the airflow AF may be increased by adjusting the speed of the fan F.

Figure 6:
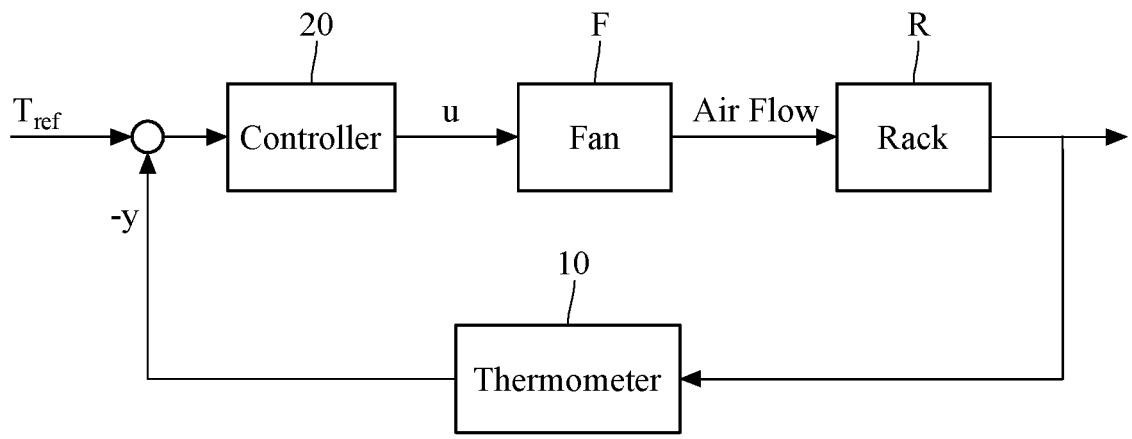
FIG. 6 illustrates a feedback schematic diagram of a rack temperature controlling method according to an embodiment of the present disclosure.

Please refer to FIG. 6, FIG. 6 illustrates a schematic feedback diagram according to an embodiment of the present disclosure. After the inlet temperature $T_i$ is measured by the thermometer 10, the controller 20 calculates the temperature variance y according to the inlet temperature $T_i$. It should be noted that, for better understanding, the temperature variance y in FIG. 6 is shown as obtained from the thermometer 10. The controller 20 then calculates the target fan speed u according to the temperature variance y and the reference temperature $T_{ref}$. Accordingly, the speed of the fan F may be controlled using the target fan speed u, and the flow rate of the airflow AF towards the rack R (comprising the first server S1 to the fourth server S4) may be further controlled. The thermometer 10 may continue to measure the temperature of the servers in the rack R after the speed of the fan F is controlled with the target fan speed u, to continue to monitor and adjust the temperature of the rack R to avoid generating hot spots.

In view of the above description, the rack temperature controlling method and system according to the present disclosure may maintain the temperature of each server in the rack at an appropriate temperature by the feedback of the rack temperature data. Further, in a server room with multiple racks, by the rack temperature controlling method and system according to the present disclosure, the controller may not need to adjust the fan speed of every fan, but only adjust the fan speed for the rack/server with hot spot. Therefore, according to the rack temperature controlling method and system according to the present disclosure, the fan speed may be adjusted more efficiently, and the overall power consumption of the cooling system (for example, may include blower, fan, etc.) of the server room may be lowered. Further, the rack temperature controlling method and system according to the present disclosure may prevent the generation of hot spots by locally increasing the airflow.

In an embodiment of the present disclosure, the rack temperature controlling method and system according to the present disclosure may solve the problem of local hot spot generated on a server, thereby maintaining the function of the server. Therefore, the sever may be suitable for artificial intelligence (AI) computation, edge computing, and may also be used as 5G server, cloud server or Internet of vehicle (IoV) server.

What is claimed is:

1. A rack temperature controlling method, comprising:
   obtaining rack temperature data;
   calculating a temperature variance according to the rack temperature data;
   calculating a temperature deviation according to the temperature variance and a reference temperature; and
   calculating a target fan speed according to the temperature deviation, and adjusting a fan speed to the target fan speed,
   wherein the target fan speed is calculated by the following equation:

$$u = K_P \times e + K_I \times \int e\, dt + K_D \frac{de}{dt}$$

wherein u represents the target fan speed; $K_P$, $K_I$ and $K_D$ are control parameters; and e represents the temperature deviation.

2. The rack temperature controlling method according to claim 1, wherein the rack temperature data comprises a plurality of inlet temperatures.

3. The rack temperature controlling method according to claim 2, wherein the temperature variance is calculated by the following equation:

$$\mathrm{Var}(T_i) = \frac{\sum_{i=1}^{n}(T_i - v)^2}{n}$$

wherein $\mathrm{Var}(T_i)$ represents the temperature variance; $T_i$ represents an i-th inlet temperature of the inlet temperatures; v represents an average temperature of the inlet temperatures; and n represents a quantity of the inlet temperatures.

4. The rack temperature controlling method according to claim 1, wherein the temperature deviation is a difference between the reference temperature and the temperature variance.

5. A rack temperature controlling system, comprising:
   a thermometer, configured to sense and output rack temperature data; and
   a controller, in signal-transmittable connection with the thermometer, the controller receiving the rack temperature data, and calculating a temperature variance according to the rack temperature data, wherein
   the controller further is configured to calculate a temperature deviation according to the temperature variance and a reference temperature to calculate a target fan speed according to the temperature deviation, and adjust a fan speed to the target fan speed,
   wherein the target fan speed is calculated by the following equation:

$$u = K_P \times e + K_I \times \int e\, dt + K_D \frac{de}{dt}$$

wherein u represents the target fan speed; $K_P$, $K_I$ and $K_D$ are control parameters; and e represents the temperature deviation.

6. The rack temperature controlling system according to claim 5, wherein the rack temperature data comprises a plurality of inlet temperatures.

7. The rack temperature controlling system according to claim 6, wherein the temperature variance is calculated by the following equation:

$$\text{Var}(T_i) = \frac{\sum_{i=1}^{n}(T_i - v)^2}{n}$$

wherein $\text{Var}(T_i)$ represents the temperature variance; $T_i$ represents an i-th inlet temperature of the inlet temperatures; v represents an average temperature of the inlet temperatures; and n represents a quantity of the inlet temperatures.

8. The rack temperature controlling system according to claim 5, wherein the temperature deviation is a difference between the reference temperature and the temperature variance.

* * * * *